United States Patent [19]

Matthews et al.

[11] Patent Number: 5,462,639
[45] Date of Patent: Oct. 31, 1995

[54] METHOD OF TREATING PARTICLES

[75] Inventors: Mark D. Matthews, Richardson; Louanne K. Brown, Garland, both of Tex.

[73] Assignee: Texas Instruments Incorporated, Dallas, Tex.

[21] Appl. No.: 181,070

[22] Filed: Jan. 12, 1994

[51] Int. Cl.⁶ .................................................. B01D 43/00
[52] U.S. Cl. ........................................ 156/662.1; 210/512.1
[58] Field of Search ................................ 156/625, 662; 210/512.1

[56] References Cited

U.S. PATENT DOCUMENTS 4,517,091  5/1985  Yamanaka et al. ................ 210/512.1
4,820,414  4/1989  Carroll et al. ..................... 210/512.1

Primary Examiner—Thi Dang
Attorney, Agent, or Firm—Robert C. Klinger; James C. Kesterson; Richard L. Donaldson

[57] ABSTRACT

Particles (10) contained in a mass of liquid etchant (12) and being wetted and etched thereby are moved into a mass of an inert, etching-terminating liquid (14) which abuts the etchant mass by overcoming surface tension forces exerted on the particles by the etchant at the interface (16,70) of the liquid masses. A vortex (24) of the inert liquid (14) is forced and in turn forces a conformal vortex (60) of the etchant (12) with the particles (10) therein. Turbulence at the interface (70) of the vortices (24,60) and vortex-generated centrifugal force on the particles (10) overcome the surface tension forces, and the particles move into the inert liquid (14).

20 Claims, 1 Drawing Sheet

METHOD OF TREATING PARTICLES

BACKGROUND OF THE INVENTION

The present invention relates to a method of treating particles. Specifically, the present invention contemplates treating particles so that they are separated from a liquid mass which is less dense than and wets the particles, and, more particularly, to a method of treating particles, such as spherical or nearly spherical (spheroidal) semiconductor particles, after they have been exposed to an etchant to render them the same size and suitable for inclusion in relevant products, by removing the particles from the etchant to terminate its effect on the particles. In specific embodiments, the particles are silicon spheres or spheroids and the products are photovoltaic solar cells.

While many types of solar cells are known, a type of particular interest herein includes a plurality of spherical or spheroidal semiconductor particles or members which protrude partially beyond, and are affixed to the walls of, apertures formed in a first flexible metal foil sheet. The details of the construction (i.e., the mechanical and electrical form, fit and function) and fabrication methodology of this type of solar cell are disclosed in the following commonly assigned U.S. Pat. Nos. 5,192,400; 5,091,319; 5,086,003; 5,028,546; 4,994,878; 4,992,138; 4,957,601; 4,917,752; 4,872,607; 4,806,495; and 4,691,076.

The construction details and the fabrication methodology of the type of solar cells to which the present invention may relate are here briefly summarized. First, generally uni-sized spheres or spheroids, or similar particles, of a semiconductor material, such as silicon, each having a p-n junction are produced, for example, by the production methods disclosed in commonly assigned U.S. Pat. Nos. 4,637,855; 5,012,619; or 5,069,740. The particles are typically constituted of an outer silicon portion of one conductivity type surrounding an inner silicon portion of another conductivity type, both portions having a selected purity and other relevant characteristics. The particles are capable of producing electricity when radiation, such as solar radiation, is incident thereon. The produced electricity may flow between conductors, one of which is electrically continuous with a portion of each sphere of one conductivity type, and the other of which is electrically continuous with a portion of each sphere of the other conductivity type. In the afore-noted patents, these conductors are preferably flexible metal foils, to the first of which the spheres are affixed, as noted above.

Typical silicon particle production techniques tend to produce batches of intermingled silicon spheres or spheroids having varying sizes and diameters. Thus, manufacturing the above type of solar cell, which preferably utilizes semiconductor particles (spheres and spheroids) of the same size, requires either a method of rendering the spheres the same size, as described in commonly assigned U.S. patent application, Ser. No. 160,020, filed Dec. 1, 1993 or a non-damaging mechanical method of sorting the fragile silicon spheres, such mechanical sorting methods being the subject of the following commonly assigned U.S. patent applications: Ser. No. 08/159,645, filed Nov. 30, 1993 ; Ser. No. 08/159,637, filed Nov. 30, 1993; and Ser. No. 08/159,872, filed Nov. 30, 1993. Whether uni-sized particles are achieved by a positive treatment step, as is the case with the '020 application, or by mechanical sorting, the manner of acquiring the particles should be efficient and have high throughput so as not to constitute a bottleneck in a solar cell manufacturing operation.

A contemplated method for manufacturing solar cells begins with forming in the first metal foil sheet a pattern of apertures, the diameters of which are slightly less than the diameters of an available quantity of same-sized particles. Several methods for forming the apertures are available and include first embossing and then etching the foil sheet or punching the sheet. After formation of the aperture pattern, the spheres are loaded onto the foil so that each aperture is occupied by a particle. Because of the relative sizes of the diameters of the same-sized particles and the apertures, the aperture-located particles merely nest in their respective apertures without substantially extending therethrough.

The particles are mechanically and electrically affixed and connected to the first foil. Such affixation and connection is achieved by applying suitable compressive forces to the foil-particle system, as set forth in the above-noted patents. Typically the application of the compressive forces is achieved by the use of a press which acts on the particles and the foil through selected compliant and rigid elements which are positioned between working surfaces of the press and the foil-particle system. These elements prevent damage to the particles and to the foil, while ensuring that the applied forces effectively move the particles partially through their respective apertures.

Partial movement of the particles through their respective apertures effects mechanical affixation thereof to the walls of their apertures and renders their outer surfaces electrically continuous with the first foil. These ends are achieved, in part, through the relationship of the larger diameters of the particles to the smaller diameters of the apertures. This relationship results in the mechanical and electrical affixation and aids in effecting the electrical continuity of the particles with the first foil. When the spheres are moved partially through their apertures, the edges of the aperture walls and the surfaces of the particles mechanically interact and mutually abrade each other to remove any natural oxide on either thereof. Thus, a metal-particle (i.e., an aluminum-silicon) bond is formed. The foregoing may be enhanced by the application of heat during the compression.

The outer portion of one conductivity type of the located and affixed particles is removed, as by etching. This removal occurs only on one side of the first foil to expose the inner particle portions of the opposite conductivity type. An electrically insulative layer is applied to or located on the exposed inner particle portions and the one foil side. Small regions of the layer which overlie the exposed inner particle portions are removed, as by abrading or etching, to create vias or openings which provide access to the inner particle portions. A second flexible metal foil is mechanically and electrically connected to the inner portions of the particles through conductive members in the vias by thermo-compression bonding or a functionally equivalent technique.

Radiant energy directed toward the free surface of the first foil falls on the particles which produce electricity. A utilization device is connected between the foils. The electricity flows from one portion, inner or outer, of the particles through one of the foils, through the utilization device and ultimately through the other foil into the other portion, outer or inner, of the particles. The insulative layer electrically insulates the foils from each other. The flexible cell may be conformed to a desired surface or shaped in a selected fashion. A protective cover may be placed over or applied to the spheres. The cover may include or comprise lenses which direct an increased amount of incident radiant energy onto the spheres to increase the efficiency of the cell.

In the past uniform particles diameters have been achieved by mechanical sorting followed by grinding or abrading oversized particles until they have the same diameter as spheres determined to be acceptable as a result of mechanical sorting. At least the grinding portion of a sorting-grinding methodology requires an abundance of time which affects the throughput of the overall solar cell manufacturing process. The '020 application describes an alternative etching method for treating over-sized particles so as to produce plural, same-sized particles.

Specifically, in the '020 application, following production of commingled silicon particles of various sizes, particles of sizes appropriate for inclusion in a solar cell may be separated therefrom leaving a quantity of oversized particles. The oversized particles are placed on a support surface, such as a screen, mesh or other apertured member. The apertures permit the passage therethrough, of particles having the proper size. Each particle is supported by a portion of the support surface which immediately surrounds a respective aperture so that each particle is superjacent to an aperture. The particles are sprayed with an etchant which passes through the support surface. When the etchant reduces an oversized particle to the proper size, the particle falls through the aperture into a collection zone. The support surface may be vibrated during etching to ensure that portions of all particles are subjected to the etchant and to aid a properly sized particle in falling through its aperture.

The collection zone includes particles and etchant. It is desirable to both terminate the effects of the etchant on the now properly sized particles and separate the properly sized particles from the etchant, following which the particles may be rinsed and dried. After rinsing and drying, the particles are ready to join those particles originally having sizes suitable for inclusion in a solar cell.

A general goal of the present invention is the provision of a method of separating particles from a body of fluid in which they are immersed, and a specific goal thereof is an efficient, high throughput, non-damaging method of treating same-sized semiconductor particles, which particles are suitable for use in fabricating a solar cell following their reduction in size by exposing them to an etchant, to separate the cells from the etchant.

SUMMARY OF THE INVENTION

With the foregoing in view, the present invention contemplates a method of treating a particle residing in a first liquid so that the particle is separated from the first liquid. The first liquid is less dense than the particle and wets the particle. In specific embodiments, the particle is a silicon particle or spheroid usable in fabricating a photovoltaic solar cell and the first liquid is an etchant, such as KOH, NaOH or $NH_3$+HF, or other particle-affecting substance. One use of the present method is to remove the particle from the etchant, and terminate the etchant's effect thereon, when the etchant has decreased the size of the particle to a selected size. An expedient use environment for the present method is a solar cell fabricating facility in which large numbers of silicon particles are treated on a continuous basis to terminate the effects on batches thereof of size-reducing etchants.

In its broadest aspect, the present method includes a step of first forming a forced vortex of a second liquid. The second liquid is denser than the first liquid, and, where the first liquid is an etchant or other particle-affecting liquid, is inert relative to the particle. Where the etchants are those described above, a specific second liquid which may be used is 3M's commercially available Fluorinert.

A forced vortex is a vortex which is created by the application of mechanical forces to a mass of a liquid. One way to create a forced vortex is to place a liquid mass in a container and then rotate the container about its vertical axis to configure the liquid mass in a vortex. Another way to create a forced vortex is to continuously, tangentially apply a stream of a liquid to a funnel- or vortex-shaped surface so that the liquid assumes the configuration of a vortex. In both cases, the apex or "tip" of the vortex is typically lowermost and the wider diverging portion of the vortex is uppermost.

A forced vortex of the first liquid is formed by contacting the interior of the second liquid vortex with the first liquid. Because of the density difference between the two liquids, they do not mix, or they mix only to a limited extent, and there is a rather well-defined interface between the two more or less conformal vortices, with the denser second liquid being beneath the less dense first liquid. The first liquid contains the particle, which as noted above, is denser than the first liquid and is wetted thereby.

If the liquids were not configured as vortices and were still, the less dense first liquid would reside in a layer atop the denser second liquid, and the particle would descend through the first liquid due to gravity until it reached the interface between the liquids. At the interface, further downward movement of the particle into the second liquid would typically not occur, because of the surface tension forces exerted on the particle by the wetting first liquid. These surface tension forces would, in effect, hold the particle within the first liquid at the interface between the liquids. Forming the liquids into forced vortices has been found to result in movement of the particle from the first liquid into the second liquid. In this manner, the effects of the first liquid (e.g., an etchant) on the particle are terminated as it moves into the second liquid (e.g., an inert liquid).

Specifically, it has been found that at the interface between the liquid vortices there is a certain amount of agitation or turbulence. Forces arising from such agitation or turbulence appear to act counter to, or to otherwise disrupt, the forces applied to the particle by the surface tension of the first liquid. Moreover, the presence of the particle in the first liquid vortex effects the application to the particle of centrifugal forces which tend to move the particle through the liquid interface and into the second fluid vortex.

After the particle moves into the second liquid vortex and the effects thereon of the first liquid are terminated, a quantity of the second liquid with the particle therein may be transported to a particle-retrieval region whereat the particle may be separated from the second liquid. Typically, the transported quantity of the second liquid with the particle therein comes from the area of the apex or bottom of the second fluid vortex, with the second liquid being moved along a closed path so as to both create the second liquid vortex and transport the particle. The closed path constitutes, in order, the second liquid vortex above its apex, the second liquid vortex apex, the particle-retrieval region, and back to the second liquid vortex above its apex. Separation of the particle from the second liquid may be achieved by preventing the particle from leaving the particle-retrieval region. The movement of the second liquid along that portion of the closed path which constitutes the second liquid vortex above its apex may, as noted, involve tangentially applying the second liquid to a vortex-shaped surface. The movement of the second fluid along the closed path, with the second fluid being removed from the apex of its vortex and resupplied above its vortex, results in the amount of the second fluid in the vortex remaining substantially constant.

It is preferred that the first liquid be added to and simultaneously subtracted from the first liquid vortex so that the amount of first liquid in its vortex also remains substantially constant. The added first liquid preferably contains the particle. In a continuous, high volume process, the added first liquid contains numerous particles which are simultaneously treated according to the above method.

DETAILED DESCRIPTION

Figure 1:
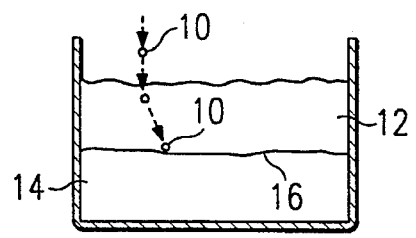
FIG. 1 is a generalized view of a particle in a first liquid from which the particle is to be separated.

FIG. 1 depicts a particle 10 in a body of a first liquid 12. The particle 10 is denser than the liquid 12, and the liquid 12 wets the particle 10. It is desired to separate the particle 10 from the liquid 12, because, for example, it may be desired to terminate the effects of the liquid 12 on the particle 10 after a selected time.

The particle 10 may be a silicon particle or spheroid of the type suitable for use in fabricating solar cells, as set forth in the above-noted commonly assigned patents. The liquid 12 may be an etchant for silicon. The silicon particle 10 may reside in the etchant 12 as a result of the practice of the invention in the commonly assigned '020 application. That is, the particle 10 may have initially been larger than its present size and larger than desired for use in a solar cell. In order to render the particle 10 a selected size, it is subjected to the action of the etchant 12 until it attains the selected size, as a consequence of which the particle 10 must be removed from the liquid 12 to terminate etching. The practice of the '020 application results in a body of etchant 12 containing one or more particles 10 of a selected size. The particles 10 are to be separated from the etchant 12.

One method of terminating the effects of the etchant 12 is to remove the particles 10 therefrom and to rinse them in water or other inert liquid. This seemingly simple expedient may not lend itself to convenient use in a continuous process wherein large numbers of particles are continuously etched to a size suitable for use in solar cells. Another method of terminating the effects of the etchant 12 is generally depicted in FIG. 1 and involves the use of a second liquid 14 which is inert relative to the particle 10. The general concept involved is to move the particle 10 from the etchant 12 into the inert liquid 14 to thereby terminate etching. If the liquids 12,14 do not mix, the etchant may be reused and the inert liquid 14 does not become contaminated by the etchant 12.

The etchant 12 is less dense than the second liquid 14, and to avoid mixing, the two liquids 12,14 are not soluble in each other. As a consequence, where the liquids are still, it has been found that a layer of the etchant 12 floats atop a layer of the second liquid. The denser particle 10 falls through the etchant 12 due to gravity, until it reaches the interface 16 between the liquids 12,14. At the interface 16, descent of the particle 10 into the second liquid 14 is impeded or prevented by forces applied to the particle 10 by the wetting etchant 12 as a result of surface tension.

Preferred etchants 12 for the silicon particles 10 are KOH, NaOH or $NH_3$+HF, while a preferred second liquid 14 is an inert liquid commercially available from 3M under the trade name "Fluorinert." "Fluorinert" has a general chemical composition of $C_xF_y$ and is a colorless, chemically inert family of liquids, which are denser than water (having a specific gravity of 1.7–1.8) and have been used for electrical isolation and insulation during circuit board testing. Two members of the "Fluorinert" family which have been used in association with the present invention are available from 3M under the designations "FC-77" and "FC-75," the latter having the chemical formula $C_8F_{18}$.

Figure 2:
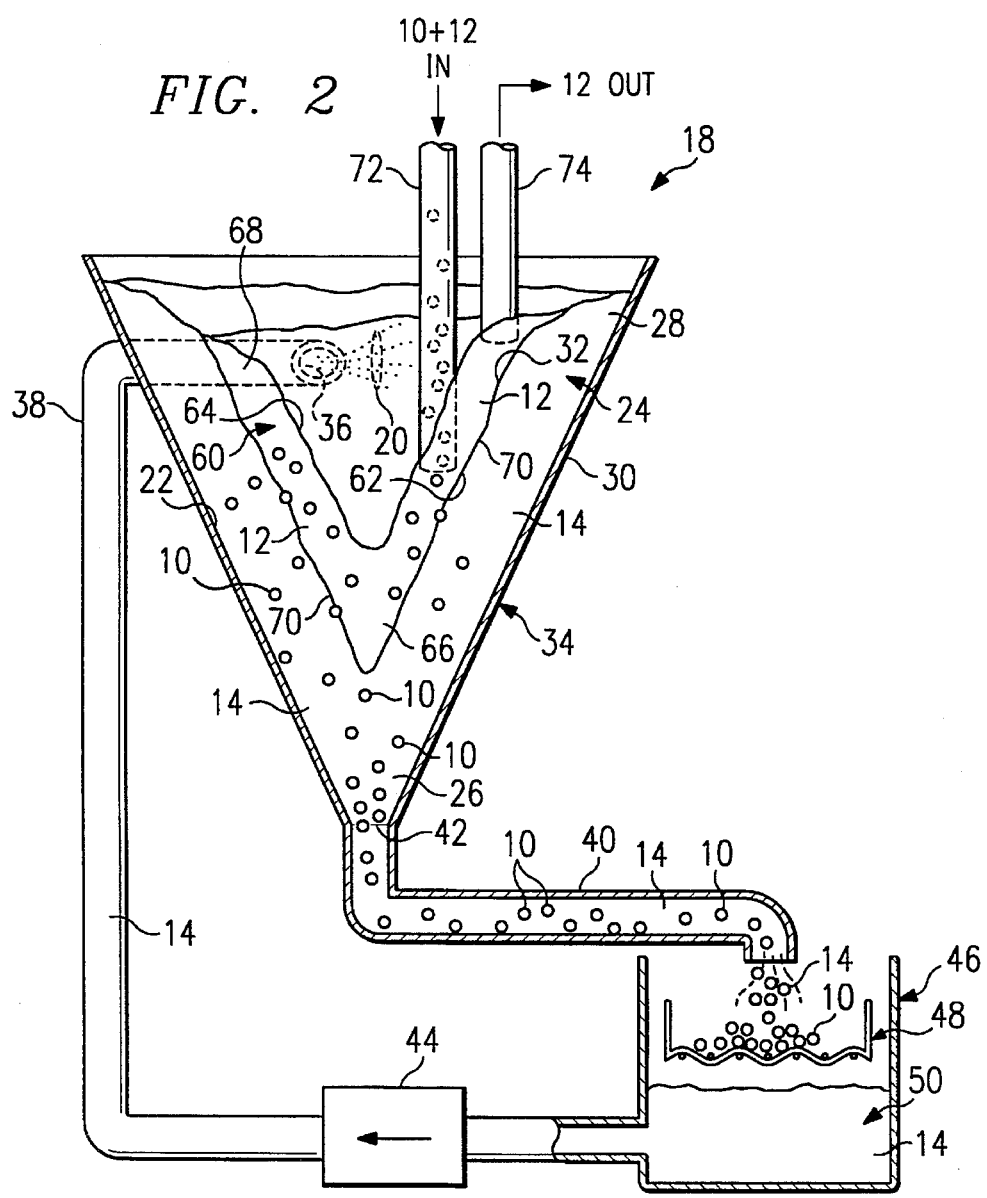
FIG. 2 is a diagrammatic, highly generalized view of apparatus for carrying out the method of the present invention whereby the particle of FIG. 1 is separated from the first liquid.

Referring now to FIG. 2, there is generally illustrated apparatus 18 for carrying out the method of the present invention.

The method of the present invention includes configuring quantities of each fluid 12,14 into a forced vortex. A forced vortex is a vortex which is created by the application of appropriate mechanical forces to a liquid or other fluid mass. There are various techniques for producing forced vortices. One technique involves placing a liquid mass in a container and then rotating the container about its major vertical axis.

Another technique of forcing a vortex, which is the technique preferred in the present invention, is to tangentially apply a stream 20 of a liquid, such as the inert liquid 14, to a funnel-shaped or vortex-shaped surface 22 until the liquid 12 assumes the configuration of a vortex 24. Ultimately, the vortex 24 "fills" with the liquid 14 so that it is a rotating, funnel-shaped liquid mass which is essentially continuous from a lowermost apex 26 to an uppermost wider divergent portion 28. The vortex 24 has an exterior surface 30, which is bounded and defined by the surface 22, and an interior surface 32.

Once the vortex 24 is established, it may be maintained at a substantially constant volume by simultaneously continuously adding and subtracting equal amounts of the liquid 14 to and from the vortex 24. Conveniently, the foregoing may be achieved by maintaining the stream 20, which continues the momentum of the vortex 24, while removing the fluid 14 from the apex 26 of the vortex 24 at the same rate as the fluid 14 is added by the stream 20. To this end, the apparatus 18 includes a funnel or other vortex-shaped member 34 which defines or includes the surface 22. Formed through the member 34 and its surface 22 are one or more ports or holes 36 from which the stream 20 of the inert liquid 14 issues tangentially to the surface 22. FIG. 2 depicts only one such port 36 for the sake of simplicity.

An input pipe or duct 38 is continuous with the port 36 (or multiple ports 36, if used) and feeds the inert liquid 14 thereto. An outlet pipe or duct 40 is continuous with an opening 42 at the bottom of the member 34 and receives the inert liquid 14 from the apex 26 of the vortex 24. The output of a pump 44 may be connected to the input pipe 38 or the output and input of the pump 44 may be respectively connected to both pipes 38,40 to force the stream 20 of the liquid 14 out of the port 36 at an appropriate velocity and mass to sustain the vortex 24. Typically, as noted, the amount of the liquid 14 entering the vortex 24 from the stream 20 is equal to the amount of the liquid 14 exiting the vortex 24 from its apex 26 through the opening 42.

In FIG. 2, the pump 44 is shown as connected to only the outlet pipe 40. In this event, the rate at which the liquid 14 is added to the vortex 24 is substantially equal to the rate at which the liquid 14 exits from the apex 26 of the vortex 24 through the opening 42 and the outlet pipe 40. This exit may, as noted, be pump-assisted as more fully explained below, the particles 10 ultimately move with the fluid 14 away from the apex 26 through the outlet pipe 40 and into a reservoir 46. Within the reservoir, the particles 10 are separated from the inert fluid 14. Separation may be achieved by directing the fluid-particle 14-10 mixture into a seive or strainer 48, with the inert liquid 14 passing therethrough and collecting into a body 50 thereof at the floor of the reservoir 46. Thereafter, the inert liquid 14 is drawn through a supply pipe or conduit 52 by the pump 44 and is reinjected into the vortex 24. The particles 10 collected in the seive 48 may be periodically removed for later use, for example, in fabricating solar cells.

A forced vortex 60 of the first liquid or etchant 10 is also formed. The forced vortex 60 is formed by contacting the interior surface 32 of the vortex 24 with a quantity of the etchant 12. Frictional engagement between the interior surface 32 of the vortex 24 and the etchant 12 configures the etchant 12 into the vortex 60. The vortex 60 is generally conformal with the vortex 24 and has an exterior surface 62 abutting the interior surface 32 of the vortex 26, an interior surface 64, a lower apex 66 and a higher divergent and wider portion 68. Because of the relative densities of the liquids 12,14, and because the liquids are not soluble in each other, the vortex 60 will reside within the vortex 26, with an interface or surface of delineation 70 being rather well defined therebetween at the abutting surfaces 32,62.

The vortex 60 could contain a fixed quantity of the etchant 12. Preferably, and to render the process continuous, etchant 12 containing the particles 10 is continuously added to the vortex 60 as particle-free etchant 12 is simultaneously removed from the vortex 60 at the same rate. The addition and removal of the etchant 12 may be achieved by appropriately placed inlet and outlet pipes 72 and 74. The inlet pipe 72 preferably inserts the etchant 12 and its contained particles 10 into the vortex 60 closer to the apex 66, while the outlet pipe 74 removes the particle-free etchant 12 from the vortex 60 closer to the upper portion 68 of the vortex 60.

The forces due to the action of the surface tension of the etchant 12 on the particles 10 at the interface 70 of the vortices 24,60 are overcome so that the particles 10 move from the etchant 12 of the vortex 60, through the interface 70 and into the inert liquid 14 of the vortex 24. In this way, the shortcomings of the technique represented by FIG. 1 are overcome.

Specifically, it has been found that particles 10 at the interface 70 are acted on by forces caused by agitation and turbulence at the interface 70. Also, centrifugal forces are applied to the particles 10 due their being entrained in and rotating with the less dense liquid 12 of the vortex 60. These centrifugal and turbulent forces have been found to counteract and disrupt the forces applied to the particles 10 by the surface tension of the liquid 12, with the result that the particles 10 move into the vortex 24 of the inert liquid 14 to terminate the effect of the etchant 12 thereon.

The particles 10 entrained in the etchant 12 enter the vortex 60 nearer the apex 66 thereof. Centrifugal force moves the particles 10 toward the interface 70 as gravity moves the particles downwardly. Accordingly, the upper regions 68 of the vortex 60, from which the etchant 12 is removed by the pipe 74, are relatively particle-free. When the particles 10 reach the interface 70, they move therethrough as described above, into the vortex 24. Within the vortex 24, centrifugal force moves the particles 10 outwardly toward the surface 22 while gravity moves the particles 10 downwardly. Ultimately, the particles 10 reach the inert liquid 12 at the apex 26 of the vortex 24 where they and the inert liquid 12 are conveyed to the reservoir 46, and the particles 10 are separated from the inert liquid 14, as described above.

The above process may be carried on continuously to treat large numbers of particles 10. The relative properties of the liquids 12 and 14 substantially prevent them from mixing or contaminating each other. Consequently, the etchant 12 which is removed via the pipe 74 may be reused if desired, for example in an etching process along the lines of that set forth in the copending '020 application. The inert liquid 14, as noted, is continuously recirculated for on-going termination of the effects of the etchant 12. It should be noted that the liquid 12 may be a particle-affecting liquid other than an etchant.

What is claimed is:

1. A method of separating at least one particle from a first liquid, the particle being denser than and being wetted by the first liquid, the method comprising:

forming a forced vortex of a second liquid which is denser than the first liquid, the liquids being insoluble in each other; and forming a forced vortex of the first particle-containing liquid by contacting the interior of the second liquid vortex with the first liquid, agitation at the interface of the vortices and the centrifugal force exerted on the particle by the vortices breaking the surface tension between the wetted particle and the first liquid and moving the particle into the second liquid.

2. A method as in claim 1, which further comprises:

transporting a quantity of the second liquid with the particle therein to a particle-retrieval region.

3. A method as in claim 2, which further comprises:

separating the particle from the second liquid at the particle-retrieval region.

4. A method as in claim 3, wherein:

the transported quantity of the second fluid is generally proximate to the apex of the second liquid vortex.

5. A method as in claim 4, wherein:

the second liquid vortex is formed and the second liquid and the particle therein are transported to the particle-retrieval region by moving the second liquid along a closed path which includes the second liquid vortex above its apex, the apex of the second liquid vortex, and the particle-retrieval region; the particle being prevented from leaving the particle-retrieval region as the second liquid moves away therefrom back to the second liquid vortex above the apex thereof.

6. A method as in claim 5, wherein:

the second liquid vortex-creating step and the second liquid-transporting step are effected by removing the second liquid from the particle-retrieval region and tangentially applying the removed second liquid to a vortex-shaped surface which contains and defines the outer boundary of the second liquid vortex, the amount of second liquid in the second liquid vortex thereby remaining substantially constant.

7. A method as in claim 1, which further comprises:

continuously adding first liquid to the first liquid vortex while subtracting second liquid therefrom so that the amount of first liquid in the first liquid vortex remains substantially constant.

8. A method as in claim 7, wherein:

the particle enters the first liquid vortex by moving thereinto with the first liquid added to the first liquid vortex.

9. A method as in claim 8 for treating a plurality of the particles which enter the first liquid vortex along with the first liquid added thereto to separate the particles from the first fluid, which further comprises:

transporting a quantity of the second liquid with the particles which have moved thereinto to a particle-retrieval region.

10. A method as in claim 9, which further comprises:

separating the particles from the second liquid at the particle-retrieval region.

11. A method as in claim 10, wherein:

the second liquid vortex is formed and the second liquid and the particles therein are transported to the particle-retrieval region by moving the second liquid along a closed path which includes the second fluid vortex above its apex, the apex of the second liquid vortex, and the particle-retrieval region; the particles being prevented from leaving the particle-retrieval region as the second liquid moves away therefrom back to the second liquid vortex above the apex thereof.

12. A method as in claim 11, wherein:

the second liquid vortex-creating step and the second liquid-transporting step are effected by removing the second liquid from the particle-retrieval region and tangentially applying the removed second liquid to a vortex-shaped surface which contains and defines the outer boundary of the second liquid vortex, the amount of second liquid in the second liquid vortex thereby remaining substantially constant.

13. A method as in claim 1, wherein:

the first liquid affects the particle and the second liquid is inert relative to the particle, movement of the particle into the second liquid terminating the effect of the second fluid thereon.

14. A method as in claim 13, wherein:

the first liquid is an etchant for the particle, movement of the particle from the first liquid vortex into the second liquid vortex terminating the etching action of the first liquid on the particle.

15. A method as in claim 14, wherein:

the particle is a silicon particle or spheroid.

16. A method as in claim 15, wherein:

the etchant is KOH, NaOH or $NH_3+HF$.

17. A method as in claim 16, wherein:

the inert fluid is Fluorinert.

18. A method as in claim 1, wherein:

the first liquid affects the particle in a first manner and the second liquid affects the particle in a second manner.

19. A method as in claim 1, wherein:

the second liquid vortex is formed by continuously supplying a sufficient mass flow rate of the second liquid substantially tangentially to the interior surface of a vortex-shaped funnel-like member at a point above the apex of the second liquid vortex and, after the second liquid vortex is initiated, simultaneously removing the second liquid from the bottom of the second liquid vortex at a similar flow rate.

20. A method of separating a particle from a liquid etchant, the particle being denser than and being wetted by the etchant, the method comprising:

forming a forced vortex of a liquid which is inert relative to the particle and which is denser than the etchant, the liquid and the particle-containing etchant being insoluble in each other, forming a forced vortex of the etchant by contacting the interior of the inert liquid vortex with the etchant, agitation at the interface of the vortices and the centrifugal force exerted on the particle by the vortices breaking the surface tension between the wetted particle and the etchant and moving the particle into the inert liquid to terminate etching of the particle, transporting a quantity of the inert liquid with the particle therein from the vicinity of the apex of the inert liquid vortex to a particle-retrieval region, and separating the particle from the inert liquid at the particle-retrieving region.

* * * * *